(12) United States Patent
Halperin et al.

(10) Patent No.: US 10,861,561 B2
(45) Date of Patent: Dec. 8, 2020

(54) THRESHOLD ESTIMATION IN NAND FLASH DEVICES

(71) Applicant: SAMSUNG ELECTRONICS CO., LTD., Suwon-si (KR)

(72) Inventors: Elisha Halperin, Ramat Gan (IL);
Evgeny Blaichman, Ramat Gan (IL);
Amit Berman, Ramat Gan (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 12 days.

(21) Appl. No.: 16/253,938

(22) Filed: Jan. 22, 2019

(65) Prior Publication Data

US 2020/0234772 A1   Jul. 23, 2020

(51) Int. Cl.
| | | |
|---|---|---|
| G11C 16/26 | (2006.01) | |
| G11C 16/34 | (2006.01) | |
| G11C 16/08 | (2006.01) | |
| G11C 16/04 | (2006.01) | |

(52) U.S. Cl.
CPC .......... G11C 16/26 (2013.01); G11C 16/0483 (2013.01); G11C 16/08 (2013.01); G11C 16/34 (2013.01)

(58) Field of Classification Search
CPC ..................................................... G11C 16/26
USPC .................................................... 365/185.17
See application file for complete search history.

(56) References Cited

U.S. PATENT DOCUMENTS

| | | | | |
|---|---|---|---|---|
| 8,259,506 | B1* | 9/2012 | Sommer | G11C 11/5642 |
| | | | | 365/185.03 |
| 9,021,331 | B2* | 4/2015 | Wu | G06F 11/1068 |
| | | | | 714/759 |
| 9,407,294 | B2* | 8/2016 | Hanham | H03M 13/3715 |
| 2017/0125110 | A1* | 5/2017 | Sankaranarayanan | ........................ |
| | | | | G11C 11/5642 |
| 2017/0148510 | A1* | 5/2017 | Bazarsky | G11C 16/26 |
| 2017/0271031 | A1* | 9/2017 | Sharon | G06F 11/3058 |
| 2018/0012663 | A1* | 1/2018 | Alhussien | H03M 13/6325 |

OTHER PUBLICATIONS

K.P. Murphy, "Iteratively reweighted least squares (IRLS)," in Machine Learning A Probabilistic Perspective, The M.I.Ij I Press, 2012, pp. 250-252.*
K.P. Murphy, "Iteratively reweighted least squares (IRLS)," in Machine Learning A Probabilistic Perspective, The M.I.T. Press, 2012, pp. 250-252.

* cited by examiner

*Primary Examiner* — Muna A Techane
(74) *Attorney, Agent, or Firm* — F. Chau & Associates, LLC (57) ABSTRACT

A method for determining an optimal threshold of a non-volatile memory device, the method including: reading a page from a nonvolatile memory device with a default threshold and attempting to hard decode the page using the default threshold; reading the page two more times with a predetermined offset voltage when the hard decoding fails and attempting to soft decode the page using the default threshold; approximating an empirical distribution of successfully decoded bits with a Gaussian distribution for each level; finding an intersection of the Gaussian distributions; and setting the intersection as a new reading threshold and reading the page again with the new reading threshold.

11 Claims, 7 Drawing Sheets

THRESHOLD ESTIMATION IN NAND FLASH DEVICES

TECHNICAL FIELD

Exemplary embodiments of the present inventive concept relate to machine learning, and more particularly, to a method for determining an optimal threshold of a NAND flash device.

DISCUSSION OF RELATED ART

Storing data in NAND flash devices and subsequently reading the NAND flash devices is often error prone. Therefore, error correcting codes are employed to compensate for this. However, when a NAND flash device has accumulated a large number of errors, the ability of the error correcting codes to overcome the errors is hampered or even disabled entirely. In this case, a reading failure and subsequent data loss may occur.

One of the factors that can lead to an increase in errors during read operations is the incorrect placement of the decision threshold between logical ones and logical zeros. In other words, an incorrect decision of a voltage level, above which a NAND flash cell is considered to contain zero, and below which the NAND flash cell is considered to contain one, can lead to in increase in read errors. Since optimal decision thresholds may differ between different blocks or wordlines in a chip, as well as between the same wordline at different times and levels of wear, a pre-chosen optimal threshold may not be ideal. As a consequence, even a pre-chosen optimal threshold can increase the amount of errors and potentially result in a read fail. Currently, several consecutive methods are employed to estimate the optimal threshold in situations where the default threshold does not suffice. These methods are as follows:

1. Reading using the default threshold.
2. Soft Decoding: Employ two more reading thresholds and use them in conjunction with the previous reading operation to assess which bits were wrong the first time. Then, attempt to decode the page again.
3. Less Read Estimation (LRE): Use three or four more reading thresholds to fit a polynomial to the joint bit distribution and use the fitted joint bit distribution to estimate the optimal threshold and decode the page.
4. Report read failure and data corruption of the page.

Beyond the limited effectiveness of these methods, another factor to consider is the read latency incurred by these methods. For example, reading from the NAND flash with a certain threshold is an expensive and time consuming operation. In other words, even if page decoding eventually succeeds, there is still a significant hit to the worst case read times. Consequently, there is a drop-off in the overall quality of service the flash system can provide.

SUMMARY

According to an exemplary embodiment of the present inventive concept, there is provided a method for determining an optimal threshold of a nonvolatile memory device, the method including: reading a page from a nonvolatile memory device with a default threshold and attempting to hard decode the page using the default threshold; reading the page two more times with a predetermined offset voltage when the hard decoding fails and attempting to soft decode the page using the default threshold; approximating an empirical distribution of successfully decoded bits with a Gaussian distribution for each level; finding an intersection of the Gaussian distributions; and setting the intersection as a new reading threshold and reading the page again with the new reading threshold.

According to an exemplary embodiment of the present inventive concept, there is provided a method for determining an optimal threshold of a NAND flash device, the method including: reading a page from a NAND flash device with a default threshold and attempting to hard decode the page using the default threshold; reading the page two more times with a predetermined offset voltage when the hard decoding fails and attempting to soft decode the page using the default threshold; approximating an empirical distribution of successfully decoded bits with a Gaussian distribution for first and second levels using an iteratively reweighted least squares (IRLS) method; finding an intersection of the Gaussian distributions; and setting the intersection as a new reading threshold and reading the page again with the new reading threshold.

According to an exemplary embodiment of the present inventive concept, there is provided a method for determining an optimal threshold of a NAND flash device, the method including: reading a page from a NAND flash device with a default threshold and attempting to hard decode the page using the default threshold; reading the page two more times with a predetermined offset voltage when the hard decoding fails and attempting to soft decode the page using the default threshold; approximating an empirical distribution of successfully decoded bits with a Gaussian distribution for each level using an iteratively reweighted least squares (IRLS) method; finding an intersection of the Gaussian distributions; and setting the intersection as a new reading threshold and reading the page again with the new reading threshold.

BRIEF DESCRIPTION OF THE FIGURES

The above and other features of the present inventive concept will become apparent from the following description taken in conjunction with the accompanying figures in which.

DETAILED DESCRIPTION OF THE EMBODIMENTS

In an exemplary embodiment of the present inventive concept, there is provided a method to increase the effectiveness of the current threshold estimations as well as reduce the time delay they incur. The method supplements or even supersedes stage 4 of the current threshold estimation algorithm. In other words, the inventive method does not require three or four additional expensive reading operations. Nevertheless, the inventive method is able to deliver comparable or even better threshold estimations.

The inventive method relies on the fact that the basic decoding unit, e.g., a frame, is strictly less than the page size. For example, as often occurs in borderline cases, when an entire page fails to decode, a few frames still succeed (and when no frame succeeds it is most likely that the BER is so bad that even finding the optimal threshold will not enable the page to be decoded). The inventive method uses the decoded frames as a sample of the page's bit distributions (e.g., the zero bits distribution and the one bits distribution), and uses the empirical distribution thus obtained to estimate page's bit distributions. The estimate is then used to calculate the intersection of the two distributions as the optimal threshold.

Since conventional soft decoding and LRE may be used in conjunction with exemplary embodiments of the inventive concept, a brief discussion thereof will now be provided.

In soft decoding or soft decision decoding, after failing to decode with a default threshold, two additional read operations are performed around the default threshold, and every bit is evaluated by all three thresholds. The bits who retain their value under all reading thresholds are considered strong bits, and the bits who do not are considered weak, with their value determined by taking the majority value. The weak bits are then flipped in an attempt to reduce the BER of the read operation, and another attempt at decoding the page is made. If this fails, LRE is attempted before declaring the data lost.

When soft decoding fails, LRE is performed. LRE requires three or four additional read operations (four, when the desired threshold is between the first and second voltage levels, and three otherwise), and attempts to fit a low order polynomial to the joint cumulative distribution of the voltage levels around the threshold. A third order polynomial may be used for the first and second voltage levels, a second order polynomial otherwise. This is done be calculating the amount of trapped bits between each threshold, and after dividing by the length of each such interval they are treated as an average value of the cumulative distribution function (cdf) at that point. With these points, a polynomial can be fitted to represent data close to the sampling points. Afterwards the minimum of the polynomial is found and assumed to be the best guess for the optimal threshold. Finally, another read operation is performed at that point to attempt to decode the page.

While useful, LRE has several shortcoming:

1. Slowness—LRE requires three to four reading operations to implement, and reading is expensive.

2. Accuracy—If the distributions are not symmetrical, a symmetric polynomial such as a second order parabola will not achieve its minimum at the intersection of the distributions. Thus, an optimal threshold is not returned under optimal conditions.

3. Rigidity—LRE does not take into account the variations in voltage distributions and attempts to fit the same polynomial to all of them, which is not optimal.

4—Locality—The polynomial approximation is a good approximation only around the sampled points. If the initial error was bad, the fitting around the optimal threshold would be poor.

The inventive method, which can supplement or supplant LRE, does not suffer from these shortcomings.

Hereinafter, a method (also referred to as "algorithm") according to an exemplary embodiment of the present inventive concept will be described with reference to the accompanying drawings.

Overview

In the method according to an exemplary embodiment of the inventive concept, after reading a page from the NAND flash, an attempt is made to decode the page using the default reading threshold. When the BER is higher than about 8e-3, the decoder will begin to fail to correctly decode the page. However, decoding is done is frames (e.g., 1 frame=1,000 bits) and if the error rate is not much above a predetermined threshold, some of the frames may still be decoded. Thus, although the entire page was not decoded, a part of it is successfully decoded. In fact, of the part that was successfully decoded, the bits were conclusively identified. These bits are then used as the empirical distribution of the bits of the entire page. In this case, the algorithm attempts to find the optimal threshold by estimating the crossing point between the zero bits distribution and the ones bits distribution. To do this, the distributions are estimated by using the iteratively reweighted least squares (IRLS) algorithm. The intersection is calculated from the estimated distributions.

Algorithm: The Decoding Sequence

Here, the general workflow of the algorithm will be described. Detailed explanations of sub-parts of the algorithm will be handled next.

Figure 1:
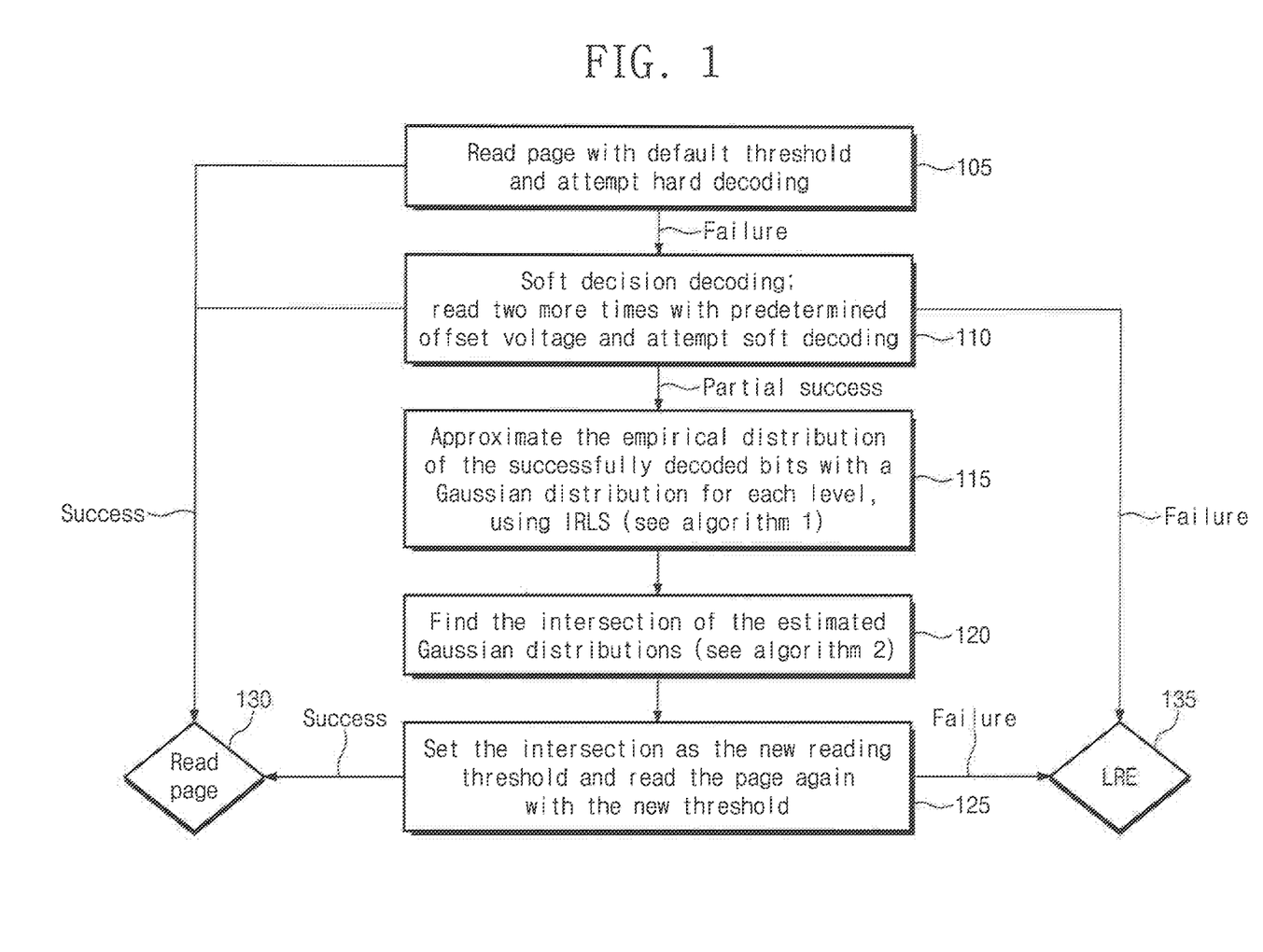
FIG. 1 is a flowchart illustrating a method for determining an optimal threshold of a NAND flash device, according to an exemplary embodiment of the inventive concept.

In reference to FIG. 1, a page is read with the default threshold and a hard decoding is attempted (105). If the hard decoding fails, a soft decision decoding is performed (110), e.g., the page is read two more times with a predetermined offset voltage and a soft decoding is attempted. If there is partial success with the soft decoding, the method performs a step of approximating the empirical distribution of the successfully decoded bits with a Gaussian distribution for each level (115). The approximation uses IRLS (see algorithm 1 below). Next, the intersection of the Gaussian distributions are found (120) using algorithm 2 below. Finally, the intersection is set as the new reading threshold and the page is read again with the new threshold (125).

As is further shown in FIG. 1, if the hard decoding of 105 is successful, the page is considered read (130), if the soft decision decoding of 110 is determined to be successful, the page is considered read (130), and if the soft decision decoding of 110 is determined to be unsuccessful, LRE is preformed (135). Furthermore, if the page read with the new threshold is determined to be successful, the page is considered read (130), and if the page read with the new threshold is determined to be unsuccessful, LRE is performed (135).

Algorithm 1: Estimation with IRLS

A. Obtaining Samples

Here, each read attempt with a threshold set to some $x_v$ indicates what part of a wordline's cells keep voltage above $x_v$ and thus read zero, and what part of the wordline's cells keep voltage below $x_v$ and thus read one. Therefore, each read attempt provides a sample from the cumulative distribution of the page, e.g., how many cells are above the threshold and how many cells are below the threshold.

Figure 2:
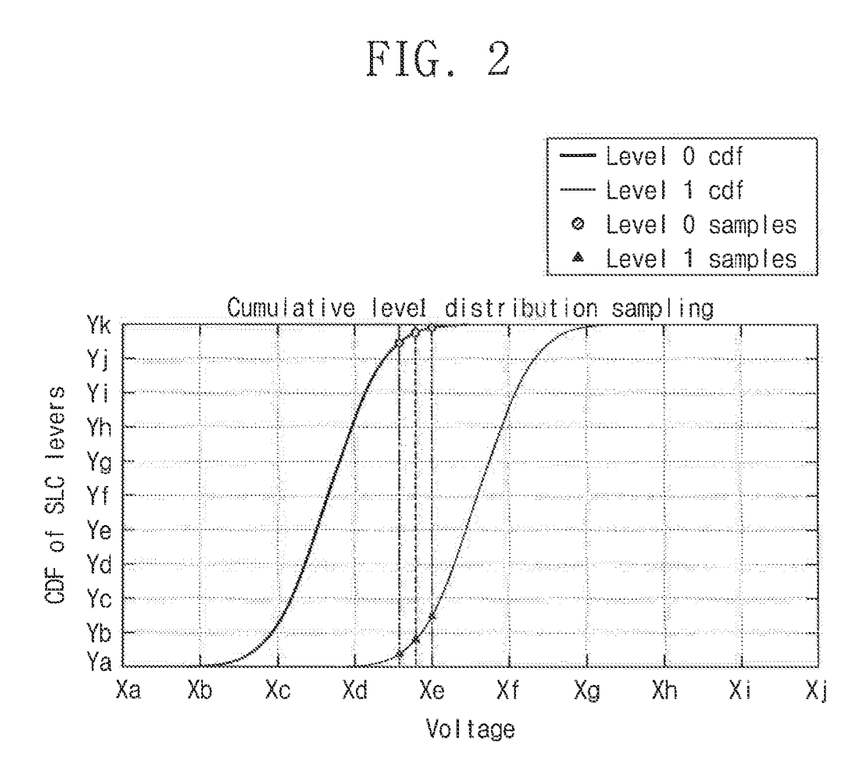
FIG. 2 is a graph illustrating estimating with iteratively reweighted least squares (IRLS) in the method of FIG. 1.

Additionally, since it is assumed that some of the frames have been partially decoded, there is a set of bits that are known (since they have been decoded). Therefore, of the decoded bits there are two samples: all the zero bits that are above the threshold, and all the one bits that are above the threshold. After attempting, the soft decision decoding we are left with three samples from each cumulative distribution as shown in FIG. 2. In FIG. 2, the x-axis represents voltage and the y-axis represents the cdf of single level cells (SLC), for example.

In FIG. 2, the left and right curves are the cumulative distributions of cell voltage levels, for cells assigned to zero and one respectively. The three vertical lines intersecting the cumulative distribution graphs (i.e., the left and right curves) are three read operations performed on the cells. For example, the central broken line is the hard decision read operation, and the two dotted lines are the two soft decision read operations. The intersection points are the empirical samples of the respective cumulative distributions obtained via partial decoding, i.e., a partially successful soft decision read operation.

B. Estimating from the Samples

Here, let s be a sampled value that was received, and $\phi$ be the percentile function. We then have $$\Phi\left(\frac{y-\mu}{\sigma}\right) = s$$

And therefore $$\Phi^{-1}(s) \cdot \sigma + \mu = y$$

And since there are three samples we get $$A = \begin{pmatrix} \Phi^{-1}(s_1) 1 \\ \Phi^{-1}(s_2) 1 \\ \Phi^{-1}(s_3) 1 \end{pmatrix} \Rightarrow A\begin{pmatrix} \sigma \\ \mu \end{pmatrix}$$

A is an overdetermined linear system. The best solution for A would be to use least squares to estimate $\mu$ and $\sigma$. However, since only a small subset of all of the pages was sampled, the samples may be very noisy, especially so on the last sample. Therefore, a weighted least squares score (weighted by the inverse of the variance of the noise) should be calculated. In addition, a determination should be made as to how much noise each sample incurs.

Accordingly, IRLS is used since it can do both things at the same time. For example, each iteration may involve recalculating the weights by taking the least absolute deviation and reassigning the weights, until the algorithm converges, thus we get:

| Algorithm 1: IRLS |
| --- |
| 1. $W^{(0)} = I$ |
| 2. $\beta^{(0)} = \vec{0}$ |
| 3. $\delta = 1e - 4$ |
| 4. $\beta^{(1)} = (A^T W^{(0)} A)^{-1} A^T W^{(0)} y$ |
| 5. while $\beta^{(t+1)} \neq \beta^{(t)}$ |
|   a.   $\beta^{(t+1)} = (A^T W^{(t)} A)^{-1} A^T W^{(t)} y$ |
|   b.   $w_i^{(t)} = \dfrac{1}{\max\{\delta, |y_i - A_i \beta^{(t)}|\}}$ |
| 6. return $\beta$ |

Here, $\beta$ is the $(\sigma, \mu)$ vector. In other words, $\beta$ is the estimate of the parameters of the Gaussian fit to the distribution. The same procedure is done for both distributions to obtain the Gaussian approximation for each of them.

Algorithm 2: Calculating the Optimal Threshold

Now that the algorithm has calculated a Gaussian approximation of the distributions, their intersections can be calculated. Furthermore, it can be proven that the intersection is the optimal threshold.

Here, let $N(\mu_1, \sigma_1^2)$, $N(\mu_2, \sigma_2^2)$ be the approximated Gaussian distributions. Using the Gaussian cdf and some algebraic manipulations to find the intersections we get:

$$\frac{1}{\sqrt{2\pi\sigma_1^2}}e^{-\frac{(x-\mu_1)^2}{2\sigma_1^2}} = \frac{1}{\sqrt{2\pi\sigma_2^2}}e^{-\frac{(x-\mu_2)^2}{2\sigma_2^2}}$$

$$\Downarrow$$

$$\sigma_2 e^{-\frac{(x-\mu_1)^2}{2\sigma_1^2}} = \sigma_1 e^{-\frac{(x-\mu_2)^2}{2\sigma_2^2}}$$

$$\Downarrow$$

$$\ln \sigma_2 - \frac{(x-\mu_1)^2}{2\sigma_1^2} = \ln \sigma_1 - \frac{(x-\mu_2)^2}{2\sigma_2^2}$$

$$\Downarrow$$

$$\sigma_1^2 \sigma_2^2 \ln \sigma_2 - \sigma_2^2(x-\mu_1)^2 = \sigma_1^2 \sigma_2^2 \ln \sigma_1 - \sigma_1^2(x-\mu_2)^2$$

Relaxing the above terms we get:

$$(\sigma_1^2 - \sigma_2^2)x^2 + 2(\mu_1\sigma_2^2 - \mu_2\sigma_1^2)x + \left(\sigma_1^2\sigma_2^2 \ln \frac{\sigma_2^2}{\sigma_1^2} + \mu_2^2\sigma_1^2 - \mu_1^2\sigma_2^2\right) = 0$$

And plugging this into the quadratic formula, the final result is:

$$x_{1,2} = \frac{-2(\mu_1\sigma_2^2 - \mu_2\sigma_1^2) \pm \sqrt{4(\mu_1\sigma_2^2 - \mu_2\sigma_1^2)^2 - 4(\sigma_1^2 - \sigma_2^2)\left(\sigma_1^2\sigma_2^2 \ln \frac{\sigma_2^2}{\sigma_1^2} + \mu_2^2\sigma_1^2 - \mu_1^2\sigma_2^2\right)}}{2(\sigma_1^2 - \sigma_2^2)}$$

$$\Downarrow$$

$$x_{1,2} = \frac{\mu_1\sigma_2^2 - \mu_2\sigma_1^2 \pm \sqrt{\sigma_1^2\sigma_2^2\left((\mu_1 - \mu_2)^2 + (\sigma_1^2 - \sigma_2^2)\ln \frac{\sigma_2^2}{\sigma_1^2}\right)}}{\sigma_1^2 - \sigma_2^2}$$

Since there can be two intersection points, the closest intersection point to the sample points is taken and returned as the optimal threshold point.

Results

A. Overview

The method according to an exemplary embodiment of the inventive concept was tested on two sets of data. One dataset was artificially generated by sampling voltages from Gaussian distributions and served as a baseline model. The other dataset used real voltage levels read from a NAND chip, with various BER characteristics, and at various stages of its lifecycle, to account for as many different scenarios as possible. While the chip is a triple-level cell (TLC) chip, the analysis was conducted in a single-level cell (SLC) setting. Here, two adjacent voltage levels from a wordline were chosen and the method was used to find the optimal threshold voltage between the adjacent voltage levels.

The method was tested against different raw BER levels, with emphasis on minimal BER. Minimal BER is around the limit of what error correction codes can handle, and where correctly identifying the optimal threshold is most important. For example, with BER too low there is no need for soft decoding, and with BER too high even an optimal threshold would not help. Varying levels of misplacing the threshold were also checked, from relatively close to optimal, to very far away. Each test was done several times and the results were averaged, to better represent typical behavior (result variance was low in any case). All tests were assumed to be able to decode only a single frame from the page, and only these bits were known to the method in advance.

Synthetic Data Experiment

Here, the performance of the method on synthetic data, which was generated from a prior Gaussian distribution, was measured. The distribution's variance was chosen at random each time from an interval to approximate real data variance. The BER was controlled by the distance between the distributions, and thus, the method was able to be tested against many different scenarios. Results are summarized in the graph of FIG. 3.

Figure 3:
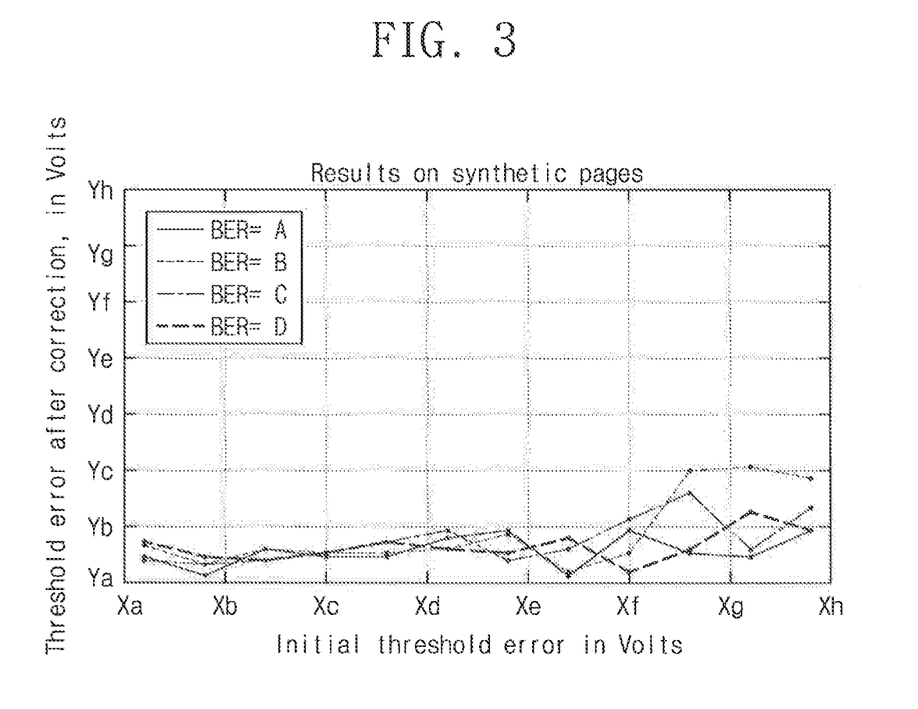
FIG. 3 is a graph illustrating results of a synthetic data experiment using the method of FIG. 1.
Figure 4:
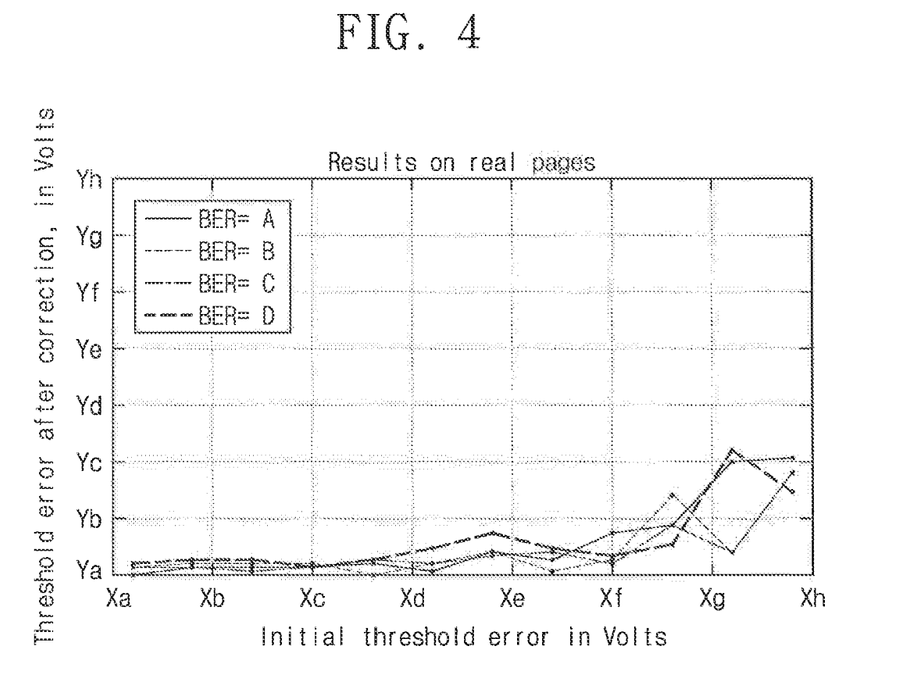
FIG. 4 is a graph illustrating results of a real data experiment using the method of FIG. 1.

FIG. 3 demonstrates the results of the method when run on the aforementioned synthetic data. The horizontal axis represents the initial threshold error, e.g., the distance measured in volts, between the actual hard decision reading voltage, and the optimal reading voltage for the hard decision read operation. The vertical axis represents the error remaining after the application of the method. In other words, the vertical axis represents the threshold error after correction in volts. The four graphs shown in FIG. 4 represent the application of the method under various levels of raw BER, e.g., BER A, BER B, BER C and BER D.

As can be seen, there is a significant and consistent improvement of the threshold, even in cases where the initial threshold was very far from optimal. The method was not significantly impacted by changing the BER, and did not show any difference when more frames were initially decoded.

Real Data Experiment

As noted above, the real dataset was produced from a NAND chip, from different blocks and different wordlines, and with various levels of raw BER, to account for as many scenarios and voltage distributions as possible. The method was then tested to see if it can deliver satisfactory results under a number of circumstances. The graph in FIG. 4 summarizes the main results.

FIG. 4 demonstrates the results of the method when run on real data extracted from a NAND chip. The horizontal axis represents the initial threshold error, e.g., the distance measured in volts, between the actual hard decision reading voltage, and the optimal reading voltage for the hard decision read operation. The vertical axis represents the error remaining after the application of the method. In other words, the vertical axis represents the threshold error after correction in volts. The four graphs shown FIG. 4 represent the application of the method under various levels of raw BER, e.g., BER A, BER B, BER C and BER D.

As can be seen, the method performed better on the real data than the synthetic data. The improvement of the initial threshold was dramatic and while slightly decreasing at the end was still very good considering the initial terrible default threshold. Additionally, at lower initial error levels, the method eliminated the error almost entirely. Here too, the initial BER did not have a significant impact on the method. The increasing number of decoded frames (the graph was made with one decoded frame) also did not have any effect on the method.

Additional Experiment for Lower BER

Figure 5:
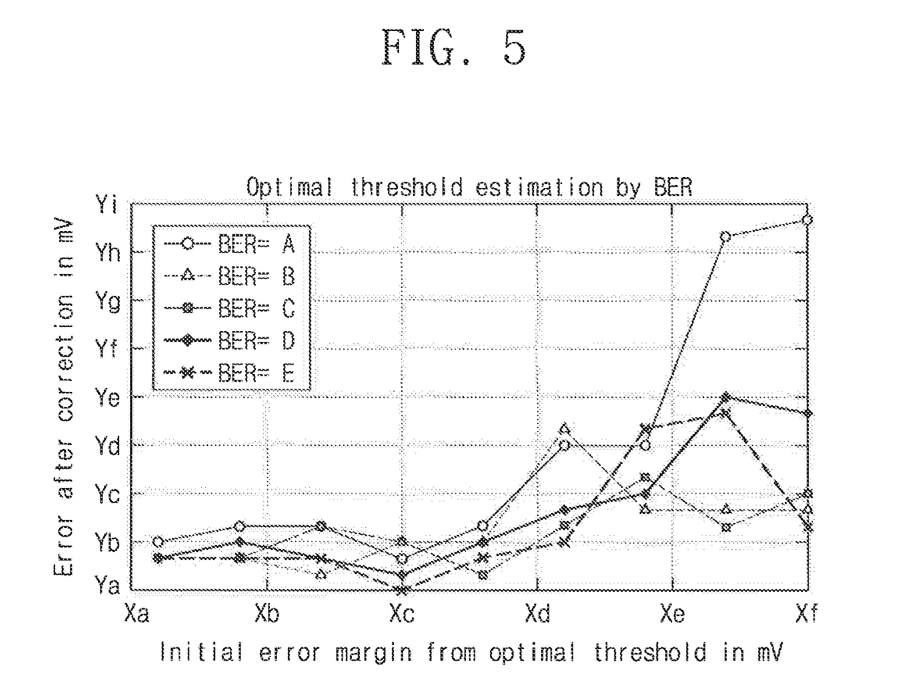
FIG. 5 is a graph illustrating additional experiments with a lower initial bit error rate (BER) performed using the method of FIG. 1.

FIG. 5 is a graph illustrating additional experiments with a lower initial BER performed using the method of FIG. 1. In FIG. 5, the BER's used are A, B, C, D and E. The x-axis represents an initial error margin from the optimal threshold in millivolts, and the y-axis represents an error after correction in millivolts. As can be seen, the results of FIG. 5 are close to the results of FIG. 4, and so the analysis remains the same.

Extensions to the Algorithm of FIG. 1

It is to be understood that the method according to an exemplary embodiment of the inventive concept may be supplemented with additional information, such as a state of the chip, current block program-erase (PE) cycle, and so on.

Direction Threshold Estimation

Since the method according to an exemplary embodiment of the inventive concept approximates voltage distributions so well, the voltage distributions may be approximated without using soft decision readings, but instead by relying on other information of the chip. This may mean better initial threshold levels for a hard decision, which will decrease the amount of times a soft decision is needed.

Estimating the Threshold in TLC

A difference in estimating a threshold in the TLC setting is that a single page is composed of bits from more than two different voltage levels. This means that even when the correct value of the bit is known, the bit cannot be assigned to a specific level. For example, on page 0, a bit of value 1 can belong to any of the levels 1, 5, 6 and 7. Thus, bit value (e.g., 0 or 1) and strength (e.g., strong or weak bit) are not enough to determine which level it was taken from. Several ways estimating a threshold in accordance with exemplary embodiments of the present inventive concept will now be discussed.

A. Additional Sensing Operations

With additional sensing operations, the exact level from which each bit was taken can be identified. For TLC chips with the (2 3 2) wiring scheme, an additional sensing operation is performed for the first and third pages in the wordline, and two additional sensing operations are performed for the second page. While this approach introduces additional sensing operations, it is still much faster than LRE, which requires seven sensing operations for the first page, nine for the second page, and six for the third page. With this approach, the number of sensing operations can be reduced by five to seven operations, relative to LRE.

B. Supplement to LRE

Another approach is to use the method of FIG. 1 as a supplement to LRE. For example, run the method simultaneously with LRE, and use LRE sensing for the method. Besides being much faster, the method is more accurate than LRE in its threshold estimation (see FIG. 6). Therefore, even if LRE is run, the method can aid LRE by supplying a more accurate estimation.

Figure 6:
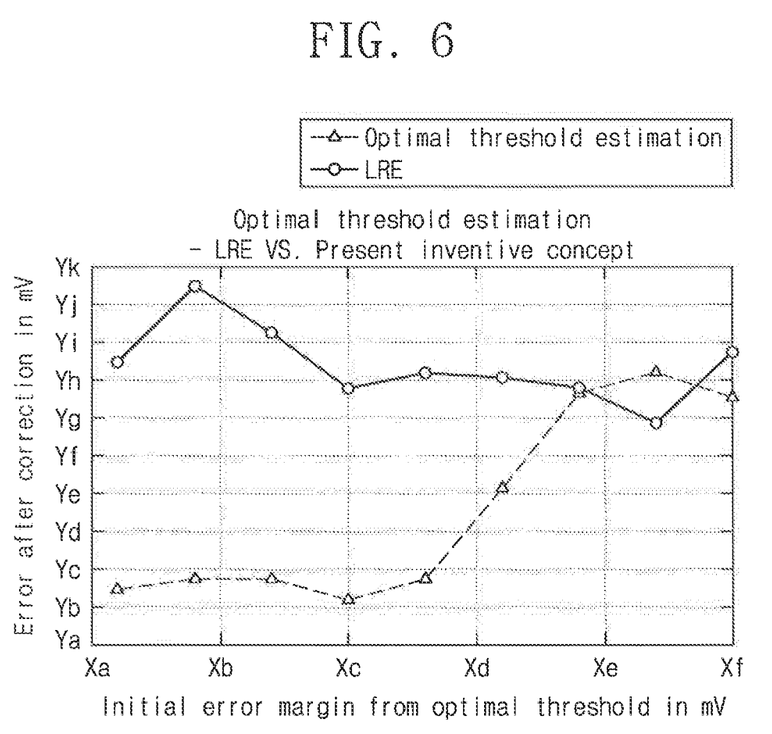
FIG. 6 is a graph illustrating a comparison between LRE and the method of FIG. 1.

The graph of FIG. 6 was produced by averaging the results of the method for initial BRE between Yb and Yc, and running LRE on the exact same datapoints. The datapoints were real voltage readings from a NAND chip, and matlab code used to run LRE was attached with code to run the method of the present inventive concept.

C. Passing Additional Information to the Decoder in the Soft Decoding Stage

Currently, the decoder in the soft decoding stage receives for each bit its value under hard decision reading and its strength. However, a lot of the information from the soft decision sensings is not transmitted to the decoder. For example, the values of the bits under each soft decoding sensing operation are not provided to the decoder. With these values, the method of the present inventive concept can be activated. Therefore, by sending the bit values during or after the soft decoding stage, the method of the present inventive concept can be used without any additional sensing operations.

Memory System

Figure 7:
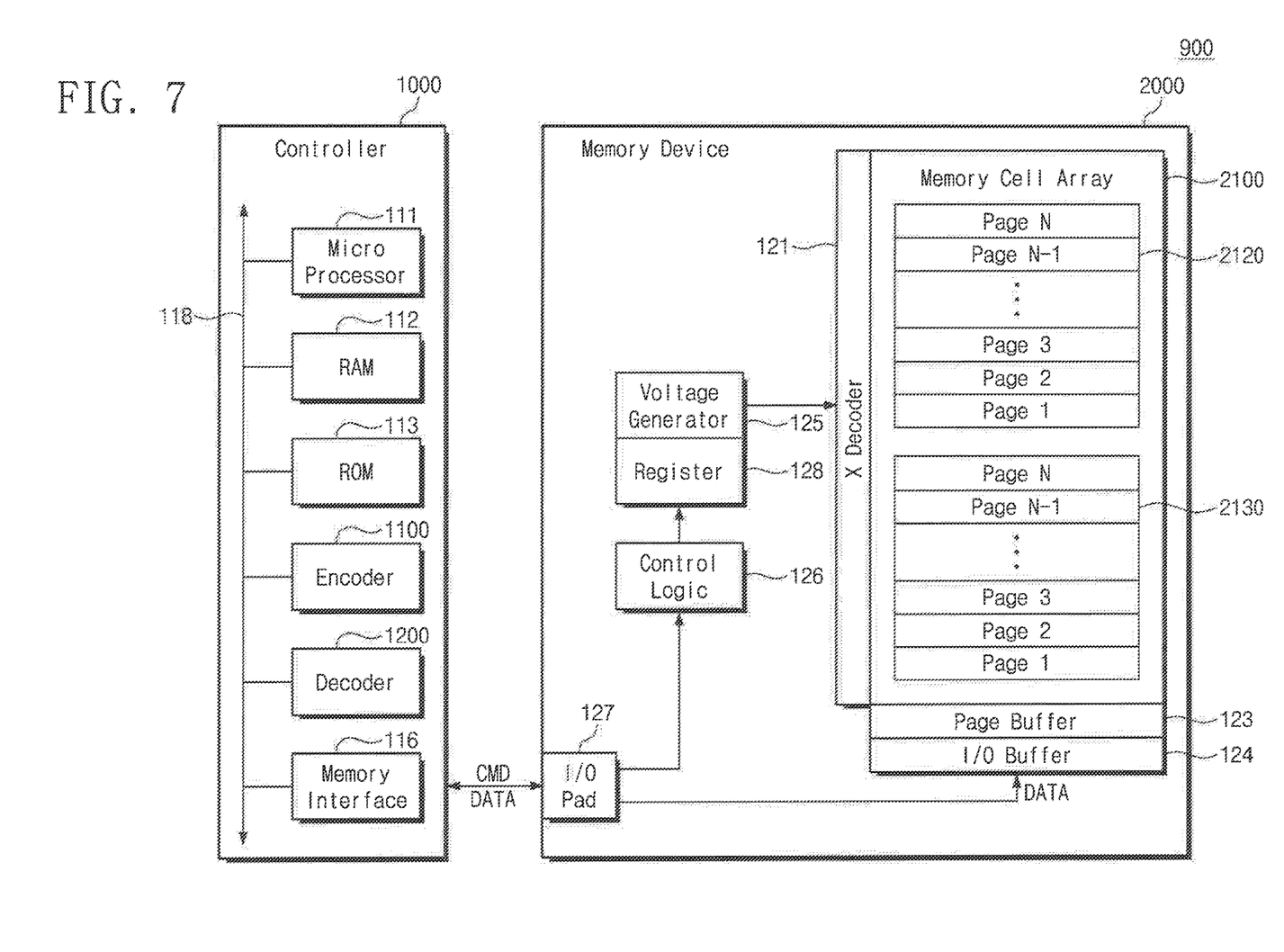
FIG. 7 is a diagram showing a memory system according to an exemplary embodiment of the inventive concept.

FIG. 7 is a block diagram of a memory system to which a method according to exemplary embodiments of the present inventive concept is applied. Referring to FIG. 7, the memory system 900 includes a memory controller 1000 and a nonvolatile memory device 2000.

The nonvolatile memory device 2000 may be, but is not limited to, a flash memory device, a NAND flash memory device, a phase change RAM (PRAM), a ferroelectric RAM (FRAM), a magnetic RAM (MRAM), etc. According to an exemplary embodiment of the inventive concept, the nonvolatile memory device 2000 may include a plurality of NAND flash memory devices. The nonvolatile memory device 2000 may have a planar structure or a three-dimensional (3D) memory cell structure with a stack of memory cells.

The nonvolatile memory device 2000 may include a memory cell array 2100, an X decoder 121, a voltage generator 125, an I/O buffer 124, a page buffer 123, and a control logic 126 each of which may be implemented as one or more circuits. The memory device may also include an input/output (I/O) pad 127.

The memory cell array 2100 includes a plurality of word lines W/L and a plurality of bit lines B/L. Each memory cell of the memory cell array 2100 may be implemented as a nonvolatile memory cell. For example, each memory cell of the memory cell array 2100 may have, for example, a floating gate or a charge storage layer such as a charge trapping layer.

The memory cell array 2100 may include a plurality of blocks and a plurality of pages. One block includes a plurality of pages. A page may be a unit of program and read operations, and a block may be a unit of erase operation. For example, the memory cell array 2100 includes a first block 2120 and a second block 2130. As is illustrated in FIG. 7, the first block 2120 includes pages 1-N, and the second block 2130 includes pages 1-N, where N is a positive integer greater than 1.

The control logic 126 controls the overall operation of the nonvolatile memory device 2000. When receiving a command CMD from the memory controller 1000, the control logic 126 interprets the command CMD and controls the nonvolatile memory device 2000 to perform an operation (e.g., a program operation, a read operation, a read retry operation, or an erase operation) according to the interpreted command CMD.

The X decoder 121 is controlled by the control logic 126 and drives at least one of the word lines W/L in the memory cell array 2100 according to a row address.

The voltage generator 125 is controlled by the control logic 126 to generate one or more voltages required for a program operation, a read operation or an erase operation and provide the generated voltages to one or more rows selected by the X decoder 121.

A register 128 is a space in which information input from the memory controller 1000 is stored and may include a plurality of latches. For example, the register 128 may group read voltage information and store the information in the form of a table.

The page buffer 123 is controlled by the control logic 126 and operates as a sense amplifier or a write driver according to an operation mode (e.g., a read operation or a program operation).

The I/O pad 127 and the I/O buffer 124 may serve as I/O paths of data exchanged between an external device, e.g., the memory controller 1000 or a host and the nonvolatile memory device 2000.

The memory controller 1000 may include a microprocessor 111, a read-only memory (ROM) 113, a random access memory (RAM) 112, an encoder 1100, a decoder 1200, a memory interface 116, and a bus 118. The elements 111 through 116 of the memory controller 1000 may be electrically connected to each other through the bus 118.

The microprocessor 111 controls the overall operation of the memory system 900 including the memory controller 1000. The microprocessor 111 is a circuit that controls other elements by generating control signals. When power is supplied to the memory system 900, the microprocessor 111 drives firmware (e.g., stored in the ROM 113) for operating the memory system 900 on the RAM 112, thereby controlling the overall operation of the memory system 900. According to an exemplary embodiment of the inventive concept, the microprocessor 111 may also issue instructions for controlling operations of other elements of the memory controller 1000 including, for example, some or all of the ROM 113, RAM 112, encoder 1100, decoder 1200, memory interface 116, and a bus 118. According to an exemplary embodiment of the inventive concept, any operations described herein as being performed by the memory controller 1000 may be performed by, or under the control of, the microprocessor 111. According to an exemplary embodiment of the inventive concept, any operations described herein as being performed by the memory controller 1000 may be performed by, or under the control of, the microprocessor 111 executing instructions that correspond to the operations and are included in program code (e.g., stored in the ROM 113).

While a driving firmware code of the memory system 900 is stored in the ROM 113, exemplary embodiments of the inventive concept are not limited thereto. The firmware code can also be stored in a portion of the nonvolatile memory device 2000 other than the ROM 113. Therefore, the control or intervention of the microprocessor 111 may encompass not only the direct control of the microprocessor 111 but also the intervention of firmware which is software driven by the microprocessor 111.

The RAM 112, which is a memory serving as a buffer, may store an initial command, data, and various variables input from a host or the microprocessor 111, or data output from the nonvolatile memory device 2000. The RAM 112 may store data and various parameters and variables input to and output from the nonvolatile memory device 2000.

The memory interface 116 may serve as an interface between the memory controller 1000 and the nonvolatile memory device 2000. The memory interface 116 is connected to the I/O pad 127 of the nonvolatile memory device 2000 and may exchange data with the I/O pad 127. In addition, the memory interface 116 may create a command suitable for the nonvolatile memory device 2000 and provide the created command to the I/O pad 127 of the nonvolatile memory device 2000. The memory interface 116 provides a command to be executed by the nonvolatile memory device 2000 and an address ADD of the nonvolatile memory device 2000.

According to an exemplary embodiment of the inventive concept, the decoder 1200 may be an error correcting code (ECC) decoder, and the encoder 1100 may be an ECC encoder. According to an exemplary embodiment of the inventive concept, the decoder 1200 and the encoder 1100 perform error bit correction. The encoder 1100 may generate data added with one or more parity and/or redundancy bits by performing error correction encoding on data before the data is provided to the nonvolatile memory device 2000. The one or more parity and/or redundancy bits may be stored in the nonvolatile memory device 2000.

The decoder 1200 may perform error correction decoding on output data, determine whether the error correction decoding is successful based on the result of the error correction decoding, and output an instruction signal based on the determination result. Read data may be transmitted to the decoder 1200, and the decoder 1200 may correct error bits of the data using the one or more parity and/or redundancy bits. When the number of error bits exceeds a limit of error bits that can be corrected, the decoder 1200 cannot correct the error bits, resulting in error correction failure. The encoder 1100 and the decoder 1200 may perform error correction using, for example, one or more of low density parity check (LDPC) code, Bose-Chaudhuri-Hocquenghem (BCH) code, turbo code, Reed-Solomon (RS) code, convolution code, recursive systematic code (RSC), or coded modulation such as trellis-coded modulation (TCM) or block coded modulation (BCM).

Each of the encoder 1100 and the decoder 1200 may include an error correction circuit, system or device.

It is to be understood that the above described methods of the inventive concept may be carried out by one or more of the above described elements of the controller 1000 and memory device 2000.

While the present inventive concept has been described with reference to exemplary embodiments thereof, it will be apparent to those skilled in the art that various changes and modifications may be made thereto without departing from the spirit and scope of the present inventive concept as defined by the attached claims.

What is claimed is:

1. A method for determining an optimal threshold of a nonvolatile memory device, the method comprising:
   reading a page from a nonvolatile memory device with a delimit threshold and attempting to hard decode the page using the default threshold;
   reading the page two more times with a predetermined offset voltage whet the hard decoding fails and attempting to soft decode the page using the default threshold;
   approximating an empirical distribution of successfully decoded bits with a Gaussian distribution for each level, wherein the successfully decoded bits are obtained from some but not all frames of the page;
   finding an intersection of the Gaussian distributions; and
   setting the intersection as a new reading threshold and reading the page again with the new reading threshold.

2. The method of claim 1, wherein the approximating of an empirical distribution of successfully decoded bits is performed when there is partial success in the reading of the page two more times.

3. The method of claim 1, wherein less read estimation (LRE) is performed when the reading of the page two more times fails completely.

4. The method of claim 1, wherein if the reading of the page again with the new reading threshold is successful, the page is returned to a calling application.

5. The method of claim 1, wherein if the reading of the page again with the new reading threshold fails, less read estimation (LRE) is performed.

6. The method of claim 1, wherein approximating an empirical distribution of successfully decoded bits with a Gaussian distribution for each level is performed using iteratively reweighted least squares (IRLS) method.

7. The method of claim 1, wherein finding an intersection of the Gaussian distributions includes selecting an intersection point closest to sample points, which were obtained while approximating the empirical distribution, as the optimal threshold.

8. The method of claim 1, wherein the nonvolatile memory device is a NAND flash device.

9. A method for determining an optimal threshold of a NAND flash device, the method comprising:
   reading a page from a NAND flash device with a default threshold and attempting to hard decode the page using the default threshold;
   reading the page two more times with a predetermined offset voltage when the hard decoding fails and attempting to soft decode the page using the default threshold;
   approximating an empirical distribution of successfully decoded bits with a Gaussian distribution for first and second levels using an iteratively reweighted least squares (IRLS) method, wherein the successfully decoded bits are derived from only decoded frames of the page;
   finding an intersection of the Gaussian distributions; and
   setting the intersection as a new reading threshold and reading the page again with the new reading threshold.

10. The method of claim 9, wherein the first level corresponds to a low voltage and the second level corresponds to a high voltage.

11. The method of claim 9, wherein the new reading threshold is located between the first level and the second level.

* * * * *